United States Patent
Hudait et al.

(10) Patent No.: US 9,006,707 B2
(45) Date of Patent: Apr. 14, 2015

(54) FORMING ARSENIDE-BASED COMPLEMENTARY LOGIC ON A SINGLE SUBSTRATE

(75) Inventors: Mantu K. Hudait, Portland, OR (US); Jack T. Kavalieros, Portland, OR (US); Suman Datta, Beaverton, OR (US); Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 2102 days.

(21) Appl. No.: 11/712,191

(22) Filed: Feb. 28, 2007

(65) Prior Publication Data

US 2008/0203381 A1 Aug. 28, 2008

(51) Int. Cl.
H01L 29/06 (2006.01)
H01L 21/8238 (2006.01)
H01L 21/8252 (2006.01)
B82Y 10/00 (2011.01)
H01L 21/8258 (2006.01)
H01L 27/06 (2006.01)
H01L 29/04 (2006.01)

(52) U.S. Cl.
CPC ............ H01L 21/8252 (2013.01); B82Y 10/00 (2013.01); H01L 21/8258 (2013.01); H01L 27/0605 (2013.01); H01L 29/045 (2013.01); H01L 29/0665 (2013.01); H01L 29/0673 (2013.01)

(58) Field of Classification Search
USPC ............. 257/14, E29.005, E21.005; 438/199, 438/191, 192, 335–338, E21.603, E21.632, 438/E21.697, E27.012, E29.005
See application file for complete search history.

(56) References Cited

U.S. PATENT DOCUMENTS

| | | | | |
|---|---|---|---|---|
| 5,011,550 A * | 4/1991 | Konushi et al. | ............ | 148/33.5 |
| 5,019,874 A * | 5/1991 | Inoue et al. | .................. | 257/190 |
| 5,051,372 A * | 9/1991 | Sasaki | .............. | 438/59 |
| 5,144,379 A * | 9/1992 | Eshita et al. | ................. | 257/194 |
| 5,192,698 A * | 3/1993 | Schuermeyer et al. | ........ | 438/169 |
| 5,504,353 A * | 4/1996 | Kuzuhara | ...................... | 257/194 |
| 5,739,558 A * | 4/1998 | Ishida et al. | ................. | 257/192 |
| 5,844,260 A * | 12/1998 | Ohori | ............................ | 257/190 |
| 2002/0185655 A1 * | 12/2002 | Fahimulla et al. | ............ | 257/192 |
| 2002/0195599 A1 * | 12/2002 | Yu et al. | ......................... | 257/18 |
| 2006/0226478 A1 * | 10/2006 | Brar et al. | ..................... | 257/341 |

OTHER PUBLICATIONS

U.S. Appl. No. 11/498,685, filed Aug. 2, 2006, entitled "Semiconductor Buffer Architecture for III-V Devices on Silicon Substrates," by Mantu K. Hudait, et al.
U.S. Appl. No. 11/527,785, filed Sep. 27, 2006, entitled "Buffer Layers for Device Isolation of Devices Grown on Silicon," by Mantu K. Hudait, et al.
U.S. Appl. No. 11/501,253, filed Aug. 2, 2006, entitled "Dislocation-Free INSB Quantum Well Structure on SI Using Novel Buffer Architecture," by Mantu K. Hudait, et al.

* cited by examiner

Primary Examiner — Hrayr A Sayadian
(74) Attorney, Agent, or Firm — Trop, Pruner & Hu, P.C.

(57) ABSTRACT

In one embodiment, the present invention includes a method for forming a logic device, including forming an n-type semiconductor device over a silicon (Si) substrate that includes an indium gallium arsenide (InGaAs)-based stack including a first buffer layer, a second buffer layer formed over the first buffer layer, a first device layer formed over the second buffer layer. Further, the method may include forming a p-type semiconductor device over the Si substrate from the InGaAs-based stack and forming an isolation between the n-type semiconductor device and the p-type semiconductor device. Other embodiments are described and claimed.

20 Claims, 2 Drawing Sheets

FORMING ARSENIDE-BASED COMPLEMENTARY LOGIC ON A SINGLE SUBSTRATE

BACKGROUND

A variety of electronic and optoelectronic devices can be enabled by developing thin film relaxed lattice constant Ill-V semiconductors on elemental silicon (Si) substrates. Surface layers capable of achieving the performance advantages of Ill-V materials may host a variety of high performance electronic devices such as complementary metal oxide semiconductor (CMOS) and quantum well (QW) transistors fabricated from extreme high mobility materials such as, but not limited to, indium antimonide (InSb), indium gallium arsenide (InGaAs) and indium arsenide (InAs).

Despite all these advantages, the growth of Ill-V materials upon silicon substrates presents many challenges. Crystal defects are generated by lattice mismatch, polar-on-nonpolar mismatch and thermal mismatch between the Ill-V semiconductor epitaxial layer and the silicon semiconductor substrate. When the lattice mismatch between the epitaxial layer and substrate exceeds a few percent, the strain induced by the mismatch becomes too great and defects are generated in the epitaxial layer when the epitaxial film relaxes the lattice mismatch strain. Many defects, such as threading dislocations and twins, tend to propagate into the "device layer" where the semiconductor device is fabricated.

In CMOS logic, high mobility n-metal oxide semiconductor (NMOS) and p-metal oxide semiconductor (PMOS) materials provide suitable characteristics for CMOS logic, which is predominately made using Si materials. However, low electron and hole mobility values using Si limit high speed and low power applications. Attempts have been made to obtain high performance NMOS using InSb Ill-V materials on polar substrate (e.g., GaAs) and PMOS using the high hole mobility germanium (Ge) material on nonpolar Si substrate. To date, integration of these two systems onto a single substrate platform has not been realized due to significant challenges.

DETAILED DESCRIPTION

In various embodiments, high electron mobility and sheet carrier density of Ill-V materials, such as indium gallium arsenide (InGaAs) for NMOS and hole mobility Ill-V material such as InGaAs for PMOS integration may be realized in a single substrate such as a Si substrate to provide for CMOS logic applications in a single substrate platform. In this way, InGaAs-based compound-semiconductor field effect transistors (FETs) may be integrated on a single substrate to provide high performance logic circuits as a result of high electron and hole mobilities for high-speed and low power application.

Figure 1:
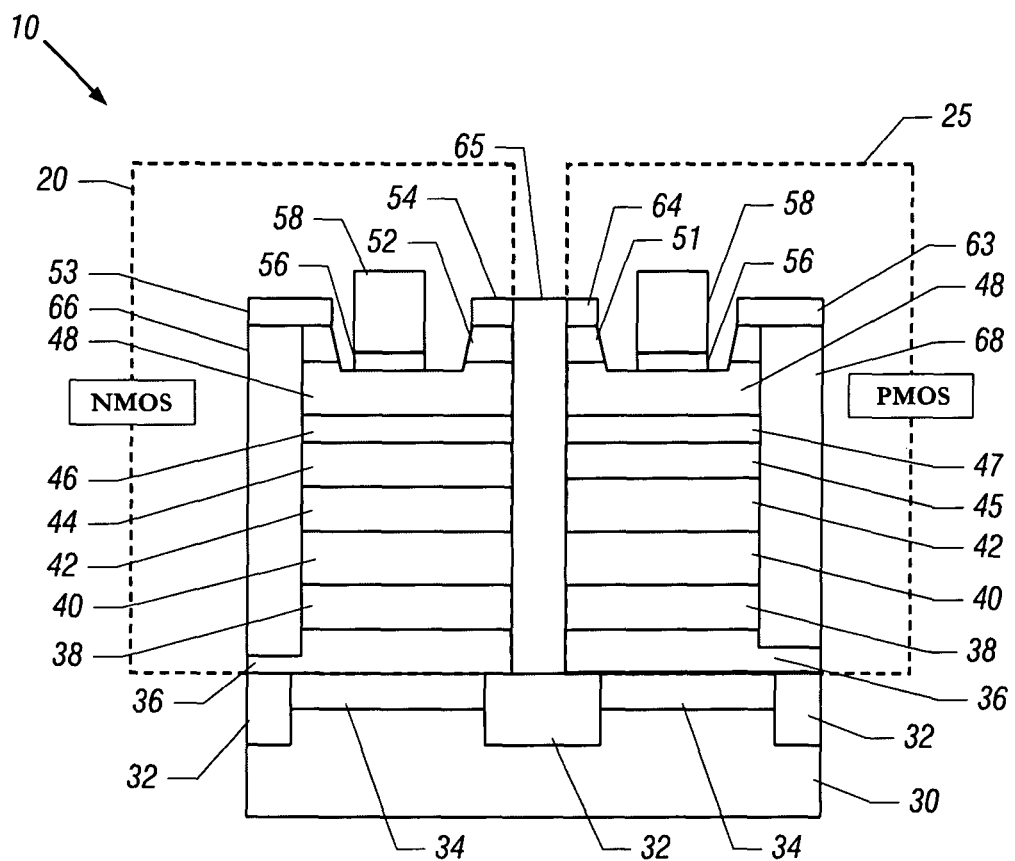
FIG. 1 is a cross section view of a logic structure in accordance with an embodiment of the present invention.

Referring now to FIG. 1, shown is a cross section view of a completed CMOS logic structure 10 in accordance with an embodiment of the present invention. As shown in FIG. 1, structure 10 includes an NMOS device 20 and a PMOS device 25 formed on a single substrate 30. In various embodiments, substrate 30 may be a high resistivity n or p-type (100) off-oriented Si substrate, although the scope of the present invention is not limited in this regard. Substrate 30 may have a vicinal surface prepared by off-cutting the substrate from an ingot. The (100) substrate 30 may be off cut at an angle between 2 and 12 degrees towards the (110) direction to produce a surface having terraces in one embodiment. In other embodiments, other off cut orientations or a substrate without an off cut may be used. Such a high resistivity substrate may provide for device isolation. Furthermore, off-cutting may eliminate anti-phase domains in anti-phase boundaries.

As shown in FIG. 1, next a nucleation layer 34 may be formed on substrate 30. In various embodiments, nucleation layer 34 may be a GaAs layer. As shown, individual devices may be separated by shallow trench isolations 32 that may be formed by a conventional etching and isolation fill processes. Nucleation layer 34 may be formed via a metal organic chemical vapor deposition (MOCVD) or molecular beam epitaxy (MBE), or another such process. Nucleation layer 34 may be used to thus fill the lowest silicon substrate terraces with atomic bi-layers of the GaAs material. Nucleation layer 34 may create an anti-phase domain-free "virtual polar" substrate. In some embodiments, nucleation layer 34 may be between approximately 30 angstroms (Å)-500 Å. In some embodiments, MBE may be performed at temperatures between approximately 400° Celsius (C.)-500° C.

Still referring to FIG. 1, next a buffer layer 36 may be formed. In various embodiments, buffer layer 36 may also be formed of GaAs. Buffer layer 36 may provide for gliding dislocation and control of the lattice mismatch of between approximately 4% to 8% between Si and a barrier layer to be formed over buffer layer 36. In some embodiments, buffer layer 36 may be formed at a higher temperature than nucleation layer 34 and may be relatively thicker in some embodiments. Buffer layer 34 may be between approximately 0.3 microns (μm) and 5.0 μm, in some embodiments.

Referring still to FIG. 1, another buffer layer 38 may be formed over buffer layer 36. In various embodiments, buffer layer 38 may be an indium aluminium arsenide ($In_xAl_{1-x}As$) material. Buffer layer 38 may be between approximately 0.5 and 2.0 microns in some embodiments.

Over buffer layer 38 a device stack or layer may be formed. This device layer may include a lower barrier layer 40, which may also be formed of $In_xAl_{1-x}As$ material, may be formed. Buffer layer 38 and lower barrier layer 40 may provide compressive strain for an InGaAs quantum well (QW) structure. Furthermore, these layers may control lattice mismatch of about another approximately 4% to further minimize threading dislocations. In some implementations, lower barrier layer 40 may be inverse step graded InAlAs or indium gallium aluminium arsenide (InGaAlAs) in order to have a larger bandgap for device isolation. Furthermore, depending upon Al percentage, strain to InGaAs can be modulated. Buffer layer 38 and lower barrier layer 40 may further provide for strain relaxation. Lower barrier layer 40 may generally be formed of a higher bandgap material than a quantum well layer to be formed thereon. Lower barrier layer 40 may be of sufficient thickness to provide a potential barrier to charge carriers in the transistor stack. In one embodiment, lower barrier layer 40 may have a thickness of between approximately 100 Å-250 Å. In other embodiments, lower barrier layer may be between approximately 2-5 μm.

Referring still to FIG. 1, a quantum well layer 42 may be formed over lower barrier layer 40. Quantum well layer 42 may be formed of a material having a smaller bandgap than that of lower barrier layer 40. In one embodiment, quantum well layer 42 may be formed of $In_xGa_{1-x}As$, where x equals between approximately 0.53-0.8. Quantum well layer 42 may be of sufficient thickness to provide adequate channel conductance. In some embodiments, quantum well layer 42 may be between approximately 10-50 nanometers (nm). Quantum well layer 42 may provide high electron mobility and velocity for NMOS devices, and also may provide high hole mobility and velocity for PMOS devices, both compared to a Si-based device.

As further shown in FIG. 1, a spacer layer 44 may be formed over quantum well layer 42 in NMOS device 20 and a corresponding spacer layer 45 may be formed over quantum layer 42 in PMOS device 25. In NMOS device 20, spacer layer 44 may be an $In_xAl_{1-x}As$ spacer layer, while in PMOS device 25 a spacer layer 45 may be formed of InAlAs. These spacer layers may provide for carrier confinement and reduced interaction between a doping layer and a two dimensional electron gas (2DEG) formed inside the channel (i.e., the channel of quantum well layer 42). Still further, these spacer layers may provide compressive strain to the channel. In various embodiments, spacer layers 44 and 45 may be approximately 20 Å to 300 Å thick.

Doping layers may be formed over spacer layers 44 and 45. More specifically, for NMOS device 20 a doping layer 46 may be present, while for PMOS device 25, a doping layer 47 may be present. Doping layer 46 may be delta-doped, modulation doped and/or combinations thereof. For example, in one embodiment doping layer 46 may be a Si modulation delta-doped layer having a thickness of approximately 3 Å-5 Å. For NMOS device 20, doping may be implemented using Si and teryllium (Te) impurities. As for PMOS device 25, doping layer 47 may be a beryllium (Be) and carbon (C) modulation delta-doped layer. Similarly, doping layer 47 may have a thickness of approximately 3 Å-5 Å.

Referring still to FIG. 1, an upper barrier layer 48 may be formed over doping layers 46 and 47 to complete the device stack or layer. In one embodiment, barrier layer 48 may be a InAlAs barrier layer. Barrier layer 48 may have a thickness of between approximately 50 Å-500 Å, and may be a Schottky barrier layer for gate control.

As further shown in FIG. 1, a contact layer 52 may be present in NMOS device 20, while a corresponding contact layer 51 may be present in PMOS device 25. Such layers may act as contact layers and may be formed of InGaAs, in various embodiments. For NMOS device 20, contact layer 52 may be n+doped, while for PMOS device 25, contact layer 51 may be p+doped. Contact layers 51 and 52 may be between approximately 30 Å-300 Å thick. These layers may be used to provide source and drain contacts with low contact resistance.

Referring still to FIG. 1, NMOS device 20 may further include a source electrode 53 and a drain electrode 54, which may be formed of contact metal using a desired deposition process. In turn, PMOS device 25 may further include a source electrode 63 and a drain electrode 64. Furthermore, a dielectric material 56 may be formed on barrier layer 48. In various embodiments, dielectric layer 56 may be formed of a high dielectric constant (high-k) material, over which a gate electrode 58 may be formed for both NMOS device 20 and PMOS device 25. Note that a gate recess etch may be performed within upper barrier layer 48 to form a gate recess on which dielectric layer 56 and gate electrode 58 may be formed. Thus a Schottky junction may be formed through which gate electrode 58 may control quantum well layer 42. In various embodiments, dielectric layer 56 and metal electrode 58 may reduce gate leakage of a metal-semiconductor FET (MESFET). Furthermore, by providing a recessed gate architecture, superior gate control may be realized, with improved external resistance (Rext) and provide for enhancement mode operation.

Also shown in FIG. 1, note that NMOS device 20 and PMOS device 25 may be isolated by a selective trench isolation 65. Similar isolations 66 and 68 may be formed at a peripheral portion of NMOS device 20 and PMOS device 25, respectively, to provide isolation to other devices also formed on substrate 30 (not shown in FIG. 1). While shown with this particular implementation in the embodiment of FIG. 1, the scope of the present invention is not limited in this regard.

Accordingly, in various embodiments devices may be formed using a high electron mobility material to form high electron mobility transistors (HEMTs) having high speed and low power consumption. Such devices may have dimensions less than approximately 50 nm with a switching frequency of approximately 562 gigahertz (GHz). Such devices may be able to operate at between approximately 0.5-1.0 volts without significant reduction of drive current. Furthermore, embodiments may provide well or gate delay at a gate length than a silicon based device.

Figure 2:
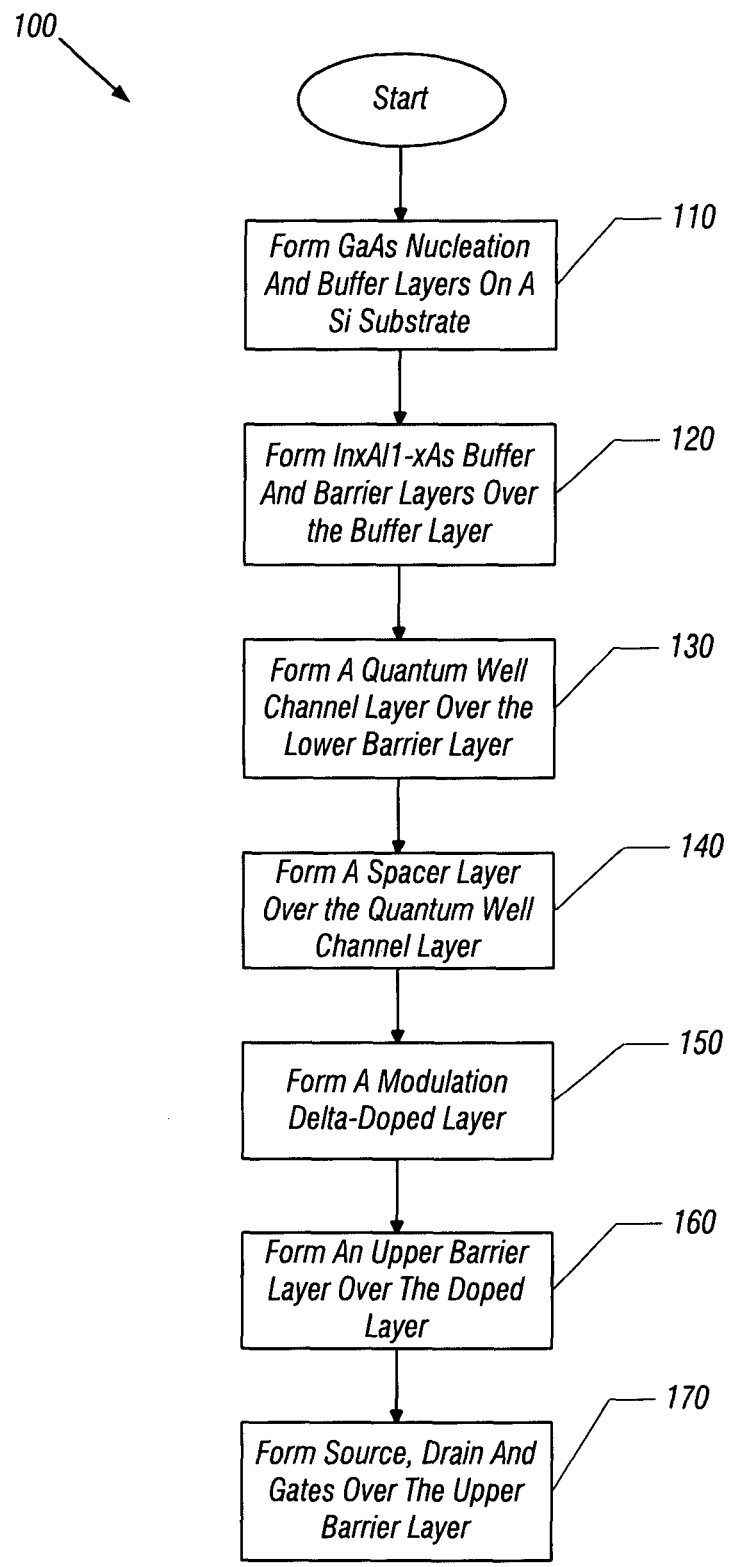
FIG. 2 is a flow diagram of a method in accordance with an embodiment of the present invention.

Referring now to FIG. 2, shown is a flow diagram of a method in accordance with an embodiment of the present invention. As shown in FIG. 2, method 100 may begin by forming a GaAs nucleation and buffer layers over a Si substrate (block 110). Next, $In_xAl_{1-x}As$ buffer and barrier layers may be formed over the GaS buffer layer (block 120). As described above, in some embodiments the lower barrier layer may be inverse step graded. Next, a QW channel layer, which may be formed of $In_xGa_{1-x}As$ may be formed over the lower barrier layer (block 130). Then a spacer layer may be formed over the quantum well (QW) channel layer (block 140). Next, a modulation delta-doped layer may be formed, with different dopings for NMOS and PMOS devices (block 150). To complete the device stack, an upper barrier layer, formed of InAlAs, may be formed over the doped layer (block 160). Finally, source, drain and gates may be formed over the barrier layer using a contact layer formed of InGaAs, and a gate electrode formed over a high-k dielectric material (block 170). While shown with this particular implementation in the embodiment of FIG. 2, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
  a silicon (Si) substrate;
  an n-type semiconductor device formed over the SI substrate from a stack including a first buffer layer, a second buffer layer formed over the first buffer layer, a first device layer formed over the second buffer layer;
  a p-type semiconductor device formed over the Si substrate from a stack including the first buffer layer, the second buffer layer formed over the first buffer layer, a second device layer formed over the second buffer layer; and
  an isolation interposed between the n-type semiconductor device and the p-type semiconductor device;
  wherein the first device layer comprises:
    a lower barrier layer that is inverse step graded within the lower barrier layer itself, the lower barrier layer comprising one of the indium aluminium arsenide ($In_xAl_{1-x}As$) an indium gallium aluminium arsenide (InGaAlAs); and
    a quantum well layer, formed over the lower barrier layer, comprising indium gallium arsenide ($In_xGa_{1-x}As$).

2. The apparatus of claim 1, wherein the first device layer comprises:
- a spacer layer formed over the quantum well layer;
- the Si-modulation delta-doped layer formed over the spacer layer; and
- an upper barrier layer formed over the Si-modulation delta-doped layer.

3. The apparatus of claim 1, wherein x of $IN_xGa_{1-x}As$ is between approximately 0.5 and 0.8.

4. The apparatus of claim 2, wherein the second device layer comprises:
- the lower barrier layer;
- the quantum well layer formed over the lower barrier layer comprising $In_xGa_{1-x}As$;
- the spacer layer formed over the quantum well layer;
- the Be-modulation delta-doped layer formed over the spacer layer; and
- the upper barrier layer formed over the Be-modulation delta-doped layer.

5. The apparatus of claim 4, wherein x of $In_xGa_{1-x}As$ is between approximately 0.5 and 0.8.

6. The apparatus of claim 1, wherein the Si substrate comprises an off-oriented substrate.

7. The apparatus of claim 4, further comprising a gate dielectric formed over a gate recess in the upper barrier layer, and a gate electrode formed over the gate dielectric.

8. The apparatus of claim 4, wherein the n-type and p-type semiconductor devices are each no more than 50 nm in height and each having a switching frequency greater than 500 GHz.

9. The apparatus of claim 4, wherein x of $In_xGa_{1-x}As$ is at least 0.51.

10. The apparatus of claim 6, wherein the off-oriented substrate is cut at an angle generally between 2 and 12 degrees towards the (110) direction.

11. The apparatus of claim 2, wherein the lower barrier layer is graded within the lower barrier layer itself so aluminum increases in a direction going away from the substrate.

12. The apparatus of claim 4, wherein:
- the lower barrier layer is graded within the lower barrier layer itself so aluminum increases in a direction going away from the substrate;
- the space layer formed over the quantum well layer in the first device layer includes $In_xAl_{1-x}As$; and
- the spacer layer formed over the quantum well layer in the second device layer includes InAlAs.

13. The apparatus of claim 1, wherein the lower barrier layer is graded within the lower barrier layer itself so aluminum increases in a direction going away from the substrate.

14. The apparatus of claim 1, wherein the lower barrier consists of $In_xAl_{1-x}As$.

15. The apparatus of claim 1, wherein the lower barrier consists of InGaAlAs.

16. An apparatus comprising:
- an n-type semiconductor device, formed over a silicon (Si) substrate, including a second buffer layer formed over a first buffer layer and under a first device layer; and
- a p-type semiconductor device, formed over the Si substrate, including the second buffer layer formed over the first buffer layer and under a second device layer;
- wherein the first device layer comprises (a) a barrier layer inverse step graded within the barrier layer itself and comprising one of indium aluminium arsenide ($In_xAl_{1-x}As$) and indium gallium aluminium arsenide (InGaAlAs); and (b) a quantum well layer, formed over the barrier layer, comprising indium gallium arsenide ($In_xGa_{1-x}As$).

17. The apparatus of claim 16, wherein the first device layer comprises a Si-modulation delta-doped layer.

18. The apparatus of claim 17, wherein the second device layer comprises the barrier layer, the quantum well layer. And the Be-modulation delta-doped layer.

19. The apparatus of claim 16. wherein the barrier layer consists of $IN_xAl_{1-x}As$.

20. The apparatus of claim 16, wherein the barrier layer consists of InGaAlAs.

\* \* \* \* \*

UNITED STATES PATENT AND TRADEMARK OFFICE
CERTIFICATE OF CORRECTION

PATENT NO.         : 9,006,707 B2
APPLICATION NO.    : 11/712191
DATED              : April 14, 2015
INVENTOR(S)        : Mantu K. Hudait et al.

It is certified that error appears in the above-identified patent and that said Letters Patent is hereby corrected as shown below:

In the Claims

Column 4:
Line 49, "SI" should be --Si--;
Line 51, before "a first" insert --and--;
Line 55, before "a second" insert --and--;
Line 62, before "indium" delete "the";
Line 63, before "indium", "an" should be --and--.

Column 5:
Line 4, "the Si-modulation" should be --a Si modulation--;
Line 8, "IN$_x$Ga$_{1-x}$As:" should be --In$_x$Ga$_{1-x}$As--;
Line 14, "layer formed" should be --layer, formed--;
Line 14, "barrier layer" should be --barrier layer,--;
Line 16, "the" should be --a--.

Column 6:
Line 5, "space" should be --spacer--;
Lines 32-33, "layer. And the" should be --layer, and a--;
Line 34, "16" should be --16,--;
Line 35, "IN$_x$Al$_{1-x}$As" should be --In$_x$Al$_{1-x}$As--.

Signed and Sealed this
Eighteenth Day of August, 2015

Michelle K. Lee
*Director of the United States Patent and Trademark Office*